United States Patent
Kondareddy et al.

(10) Patent No.: US 10,372,190 B1
(45) Date of Patent: Aug. 6, 2019

(54) SYSTEM AND METHODS FOR ARBITRATING COMMUNICATIONS BY COLLOCATED COMMUNICATION CIRCUITRY

(71) Applicant: Cypress Semiconductor Corporation, San Jose, CA (US)

(72) Inventors: Raghunatha Kondareddy, Fremont, CA (US); Rajendra Kumar Gundu Rao, Bangalore (IN); Raghavendra Kencharla, Bangalore (IN); Wenyu Liu, Tustin, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 16/143,032

(22) Filed: Sep. 26, 2018

Related U.S. Application Data

(60) Provisional application No. 62/689,948, filed on Jun. 26, 2018.

(51) Int. Cl.
| | |
|---|---|
| *G06F 1/3209* | (2019.01) |
| *H04W 72/12* | (2009.01) |
| *H04W 52/02* | (2009.01) |
| *H03K 19/00* | (2006.01) |

(52) U.S. Cl.
CPC ....... *G06F 1/3209* (2013.01); *H03K 19/0008* (2013.01); *H04W 52/02* (2013.01); *H04W 72/1215* (2013.01); *H04W 72/1242* (2013.01)

(58) Field of Classification Search
CPC ............. H04W 88/06; H04W 72/1215; H04W 72/1242; H04W 72/1247; H04W 52/02; G06F 1/3209; H03K 19/0008
See application file for complete search history.

(56) References Cited

U.S. PATENT DOCUMENTS

| | | | |
|---|---|---|---|
| 8,072,913 B2 | 12/2011 | Desai | |
| 8,134,992 B1 | 3/2012 | Nam et al. | |
| 8,199,709 B2 | 6/2012 | Su et al. | |
| 8,223,693 B2 | 7/2012 | Ko et al. | |
| 8,331,289 B1 | 12/2012 | Lee et al. | |
| 8,345,704 B2 | 1/2013 | Desai et al. | |
| 8,442,016 B1* | 5/2013 | Lee ................... | H04W 72/1215 370/338 |
| 8,520,586 B1 | 8/2013 | Husted et al. | |

(Continued)

OTHER PUBLICATIONS

AN1017: Zigbee and Thread Coexistence with Wi-Fi., Silicon Labs; 42 pages.

(Continued)

*Primary Examiner* — Devan A Sandiford

(57) ABSTRACT

An example system and method, during operation of first communication circuitry in a first operating mode comprising first power consumption, uses the first communication circuitry to perform packet arbitration for wireless communications by the first communication circuitry, second communication circuitry, and third communication circuitry. During operation of the first communication circuitry in a second operating mode comprising second power consumption, the example system and method uses the second communication circuitry to perform packet arbitration for wireless communications by the second communication circuitry and a third communication circuitry.

20 Claims, 7 Drawing Sheets

(56) References Cited

U.S. PATENT DOCUMENTS

| | | | | |
|---|---|---|---|---|
| 8,606,184 | B1* | 12/2013 | Luthra | H04B 17/318 370/229 |
| 8,744,356 | B2* | 6/2014 | Ko | H04W 84/12 455/41.2 |
| 8,848,676 | B1* | 9/2014 | Wheeler | H04B 7/0802 370/311 |
| 8,861,469 | B1 | 10/2014 | Lee et al. | |
| 8,908,667 | B1* | 12/2014 | Wong | H04B 1/04 370/327 |
| 9,326,284 | B2 | 4/2016 | Smadi | |
| 9,893,744 | B1* | 2/2018 | Patel | H04B 7/26 |
| 9,967,897 | B2 | 5/2018 | Ko et al. | |
| 2002/0003790 | A1* | 1/2002 | Heppe | H04B 7/0802 370/338 |
| 2004/0192222 | A1* | 9/2004 | Vaisanen | H04B 1/3805 455/78 |
| 2005/0059347 | A1* | 3/2005 | Haartsen | H04W 16/14 455/41.2 |
| 2006/0030266 | A1* | 2/2006 | Desai | H04W 16/14 455/41.2 |
| 2006/0292986 | A1* | 12/2006 | Bitran | H04W 16/14 455/41.2 |
| 2007/0060055 | A1* | 3/2007 | Desai | H04B 1/406 455/41.2 |
| 2007/0112986 | A1* | 5/2007 | Chang | G06F 13/364 710/116 |
| 2007/0238483 | A1* | 10/2007 | Boireau | H04B 1/0057 455/553.1 |
| 2007/0275746 | A1* | 11/2007 | Bitran | H04W 16/14 455/509 |
| 2008/0102885 | A1* | 5/2008 | Tu | H04B 1/3805 455/553.1 |
| 2008/0123610 | A1* | 5/2008 | Desai | H04L 47/14 370/339 |
| 2008/0238807 | A1* | 10/2008 | Ibrahim | H01Q 21/29 343/876 |
| 2008/0253352 | A1* | 10/2008 | Thoukydides | H04W 72/1215 370/345 |
| 2008/0259837 | A1* | 10/2008 | Thoukydides | H04W 16/14 370/311 |
| 2008/0259846 | A1* | 10/2008 | Gonikberg | H04W 72/1215 370/328 |
| 2008/0279137 | A1 | 11/2008 | Pemu et al. | |
| 2008/0279138 | A1* | 11/2008 | Gonikberg | H04W 8/005 370/328 |
| 2008/0279162 | A1* | 11/2008 | Desai | H04W 72/1215 370/338 |
| 2008/0279163 | A1* | 11/2008 | Desai | H04W 52/267 370/338 |
| 2008/0279264 | A1* | 11/2008 | Desai | H04W 16/14 375/220 |
| 2009/0063740 | A1* | 3/2009 | Yeh | H04W 72/1215 710/113 |
| 2009/0103474 | A1* | 4/2009 | Lu | H04W 16/14 370/328 |
| 2009/0116437 | A1* | 5/2009 | Alexandre | H04W 48/18 370/329 |
| 2009/0129367 | A1* | 5/2009 | Bitran | H04W 72/1257 370/350 |
| 2009/0137206 | A1* | 5/2009 | Sherman | H04W 16/14 455/41.2 |
| 2009/0147763 | A1* | 6/2009 | Desai | H04B 1/0064 370/343 |
| 2009/0238158 | A1* | 9/2009 | Lewis | H04W 72/1257 370/338 |
| 2009/0245279 | A1* | 10/2009 | Wan | H04W 72/1215 370/468 |
| 2009/0247217 | A1* | 10/2009 | Hsu | H04W 88/06 455/553.1 |
| 2009/0258607 | A1* | 10/2009 | Beninghaus | H04B 1/3805 455/77 |
| 2009/0285167 | A1* | 11/2009 | Hirsch | H04W 72/1215 370/329 |
| 2010/0008338 | A1 | 1/2010 | Tsfati et al. | |
| 2010/0029325 | A1* | 2/2010 | Wang | H04W 72/1215 455/553.1 |
| 2010/0165973 | A1* | 7/2010 | Su | H04W 72/1215 370/345 |
| 2010/0278129 | A1* | 11/2010 | Chu | H04W 72/1215 370/329 |
| 2010/0304770 | A1* | 12/2010 | Wietfeldt | H04W 72/1215 455/509 |
| 2010/0322159 | A1* | 12/2010 | Ko | H04W 52/281 370/329 |
| 2011/0268024 | A1* | 11/2011 | Jamp | H04W 16/14 370/328 |
| 2011/0268051 | A1* | 11/2011 | Tsao | H04W 4/80 370/329 |
| 2013/0010766 | A1* | 1/2013 | Sadek | H04W 72/1215 370/336 |
| 2014/0334396 | A1* | 11/2014 | Lee | H04L 5/0062 370/329 |
| 2018/0132071 | A1* | 5/2018 | Baek | H04W 4/08 |

OTHER PUBLICATIONS

International Search Report for International application No. PCT/US19/31368 (CD17104W0) dated Jun. 20, 2019, 2 pages.

Witten Opinion of the International Searching Authority for International application No. PCT/US19/31368 (CD17104W0) dated Jun. 20, 2019, 3 pages.

* cited by examiner

SYSTEM AND METHODS FOR ARBITRATING COMMUNICATIONS BY COLLOCATED COMMUNICATION CIRCUITRY

RELATED APPLICATIONS

This application claims the priority benefit of U.S. Provisional Application No. 62/689,948, filed Jun. 26, 2018, which is incorporated herein by reference in its entirety.

TECHNICAL FIELD

The subject matter relates to the field of wireless communications. More specifically, but not by way of limitation, the subject matter discloses techniques for arbitrating communications by collocated communication circuitry.

BACKGROUND

Some communication systems include collocated communication circuitry to transfer data via in accordance with multiple wireless communications protocols. For example, some communication systems include a radio that utilizes Wireless Local Area Network (WLAN) communication protocol (e.g., Wi-Fi based on IEEE 802.11 standards), a radio that utilizes Bluetooth (BT) communication protocol (e.g., based on BT SIG standards), and a radio that utilizes Zigbee (ZB) communication protocol (e.g., based on IEEE 802.15.4 standards), where the radios are all in close proximity to one another. Collocated radios operating simultaneously in adjacent or overlapping radio frequency (RF) spectrums can reduce operating ranges and/or lower throughput. At the expense of power consumption, arbitration techniques may be implemented by such communication systems to improve performance by managing each radio's access to transmission media.

BRIEF DESCRIPTION OF THE DRAWINGS

Some embodiments are illustrated by way of example and not limitation in the figures of the accompanying drawings in which.

DETAILED DESCRIPTION

Figure 1:
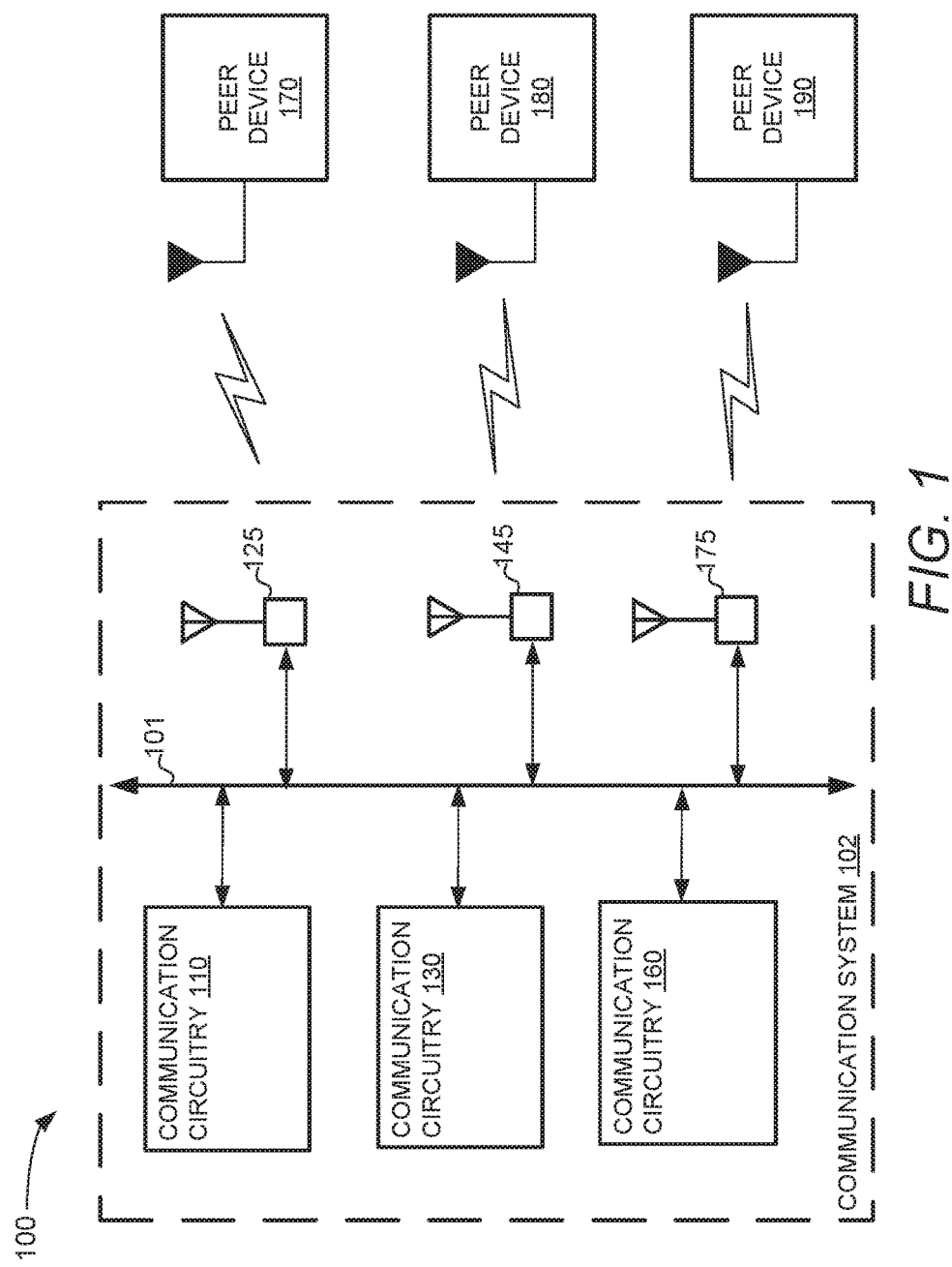
FIG. 1 is a block diagram illustrating a wireless communication network, in accordance with various embodiments.

Systems and methods for arbitrating communications by collocated communication circuitry are described. In the following description, for purposes of explanation, numerous examples and embodiments are set forth in order to provide a thorough understanding of the claimed subject matter. It will be evident to one skilled in the art that the claimed subject matter may be practiced in other embodiments. Some embodiments are now briefly introduced and then discussed in more detail along with other embodiments beginning with FIG. 1.

When multiple communication circuitry (e.g., radios) are operating concurrently or simultaneously in proximity to one another, coexistence problems can arise. This can lead to performance degradation, which is manifested, for example, in reduced operating range and/or lower throughput. Coexistence problems can range in severity and may arise from, without limitation, collocated radios operating in overlapping frequency spectrums (e.g., WLAN, BT, and ZB in 2.4 GHz range), collocated radios operating in adjacent frequency spectrum (e.g., cellular such as Long-Term Evolution (LTE) band 7 and band 40), and/or harmonics and inter-modulation distortion among collocated radios.

Collaborative coexistence techniques provide a methodology by which communication circuitry for multiple communication protocols can be collocated on a device (e.g., a small form-factor device). Coexistence solutions can be implemented at the chip level, the board level, the software level (e.g., firmware), and/or through antennas. In example embodiments, mitigation of coexistence problems may be achieved by optimizing hardware such as board layout of RF signal routing and component placement, e.g., antenna isolations, cellular RF and RFIC components, WLAN, BT, global positioning system (GPS), and ZB RFIC and RF components, and by using filters in the receivers and transmitters. Coexistence solutions may also be achieved through PHY/Software optimization such as time domain multiplexing of radios with time synchronization of radio frames using, for example, 2-wire and/or 3-wire coexistence interfaces.

An objective of arbitration is to maintain acceptable operating ranges and throughput. Arbitration logic can facilitate coexistence by deciding which communication subsystem should be granted access to the transmission medium during a particular period. Arbitration algorithms may include, without limitation, IEEE 802.15.2 Packet Traffic Arbitration (PTA). In current techniques, the role of arbitrator is implemented by one of the multiple collocated communication circuitry (e.g., a Wi-Fi subsystem) and in order for the arbitration logic to be available to perform arbitration, certain power domains of the communication circuitry may never be allowed to power down. The level of power consumed by the always on communication circuitry that runs the arbitration logic drains power, which is especially impactful in a battery powered communication devices such as those used in the IoT.

In embodiments, power consumption can be lessened through the provision of arbitration functionality by different communication circuitry during selected periods. For example, arbitration logic may be disposed on two out of three communication subsystems of a communication system. First arbitration logic running on a first communication subsystem may arbitrate for communication by all three communication subsystems when the first communication subsystem is operating in a first mode comprising a first power consumption. When the first communication subsystem is to transition to operating in a mode comprising a lower power consumption, second arbitration logic running on the second communication subsystem can take over to arbitrate for communications by the second communication subsystem and a third communication subsystem. As a result, the first communication subsystem is allowed to consume less power by shutting down certain of its power domains for the periods that they are not needed.

Embodiments described herein can reduce power consumed by a communication system by sharing or delegating the arbiter role (e.g., through a handover and takeback protocol) among any number of collocated communication subsystems while providing throughput and quality of service comparable to those provided by single arbiter, collocated communication subsystems that must always remain on to provide arbitration.

The detailed description below includes references to the accompanying drawings, which form a part of the detailed description. The drawings show illustrations in accordance with embodiments. These embodiments, which are also referred to herein as "examples," are described in enough detail to enable those skilled in the art to practice embodiments of the claimed subject matter. The embodiments may be combined, other embodiments may be utilized, or structural, logical, and electrical changes may be made without departing from the scope of what is claimed. The following detailed description is, therefore, not to be taken in a limiting sense, and the scope is defined by the appended claims and their equivalents.

FIG. 1 is a block diagram illustrating a wireless communication network 100, in accordance with various embodiments. FIG. 1 is shown to include a communication system 102 wirelessly communicating with peer devices 170, 180, and 190. The communication system 102 includes collocated communication circuitry 110, 130, and 160 coupled to antennas 125, 145, and 175 via a bus system 101. The bus system 101 may include inter-chip busses, intra-chip busses, coexistence busses, or any other communication line to connect circuits. In various embodiments, some or all of the communication circuitry 110, 130, and 160 may be disposed on a common substrate (e.g., a system on a chip) or on different substrates. Alternatively or additionally, one or more of the communication circuitry 110, 130, and 160 may be disposed on a same or discrete integrated circuit (IC) chip(s).

Although the communication system 102 is shown to include three antennas, the communication system 102 may include fewer or greater that three antennae without departing from the claimed subject matter. For example, in some embodiments, the communication system 102 may include one or more antenna array (e.g., a phased array) including any number of antennae (e.g., six or eight) while in other embodiments, the communication system may include as little as one antenna shared among the communication circuitry 110, 130, and 160. Further, an antenna may by exclusively paired with communication circuitry or shared among the communication circuitry.

In an embodiment, each communication circuitry 110, 130, and 160 represents a communication subsystem configured to facilitate communication according to a communication protocol. For example, each communication circuitry 110, 130, and 160 and a corresponding antenna 125, 145, and/or 175 may communicate using overlapping frequency spectra (e.g., WLAN, BT, and ZB in 2.4 GHz range) and/or using adjacent frequency spectra (e.g., cellular protocols such as LTE band 7 and band 40). In embodiments, each peer device 170, 180, and 190 wirelessly communicates with a corresponding communication circuitry 110, 130, and 160 using a corresponding overlapping and/or adjacent frequency spectra. Peer devices 170, 180, and 190 may include any type of electronic device capable of wirelessly communicating with the communication system 102.

In an embodiment, each communication circuitry 110, 130, and 160 and its corresponding antennae 125, 145, and/or 175 operate in overlapping and/or adjacent RF spectrums, raising coexistence problems that affects quality of service and can reduce operating range and/or lower throughput. If an arbitrator role were to be provided by only one of the communication circuitry 110, 130, and 160, power domains of that communication circuitry would need to remain powered on even when the communication circuitry is not actively communicating. The level of power consumed by always on communication circuitry drains power, which is especially disadvantageous in a battery powered communication device such as one used in the IoT. Embodiments that mitigate such power consumption are discussed with respect to FIG. 2.

Figure 2:
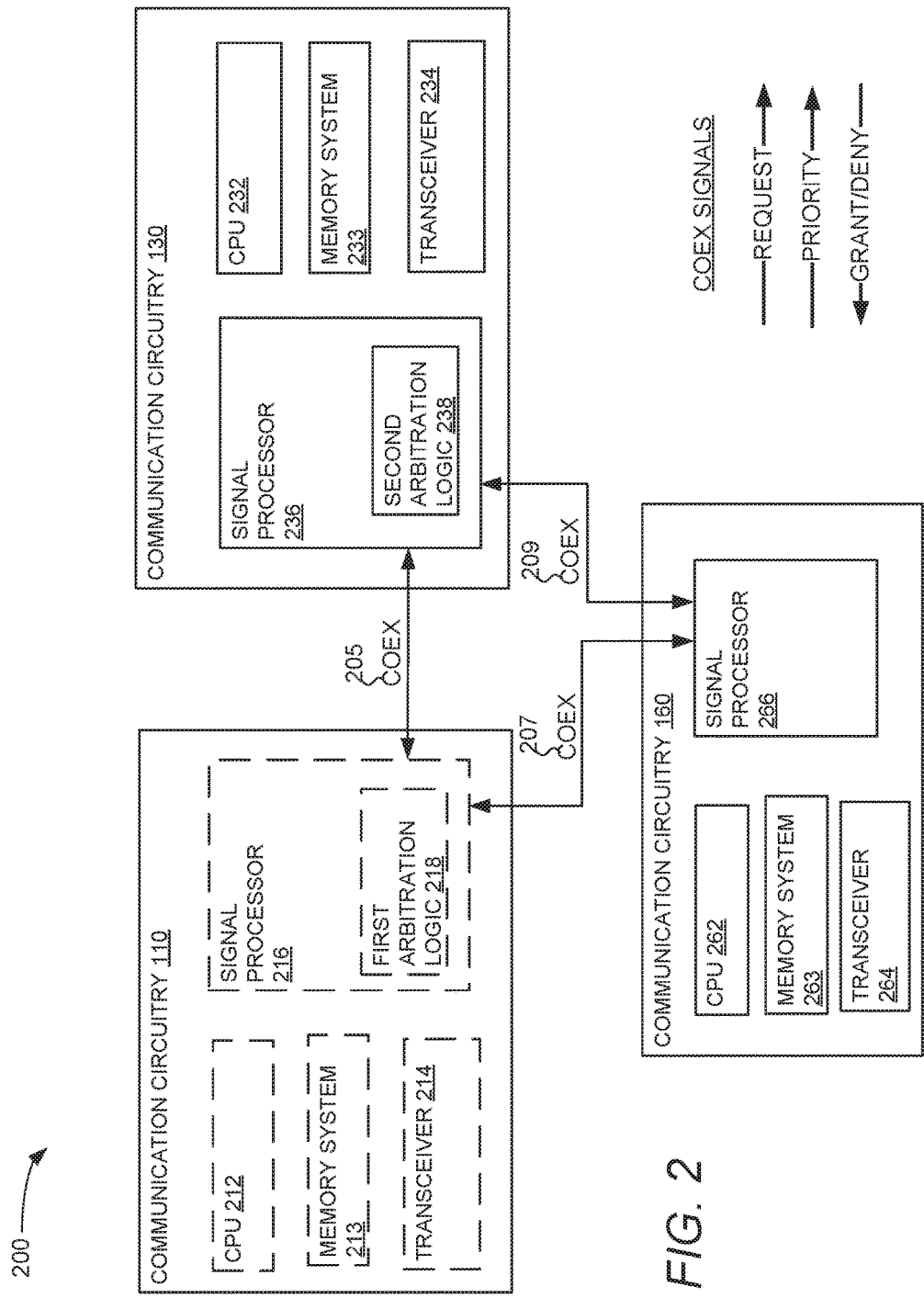
FIG. 2 is a block diagram illustrating communication circuitry of a communication system, in accordance with embodiments.

FIG. 2 is a block diagram illustrating communication circuitry 110, 130, and 160 of a communication system 200, in accordance with embodiments. The communication circuitry 110, 130, and 160 are shown to be coupled to one another via coexistence interfaces 205, 207, and/or 209. The communication circuitry 110 is shown to include a central processing unit (CPU) 212, a signal processor 216, memory system 213, and a transceiver 214. The CPU 212 is to execute communication circuitry 110 operations based on instruction stored within the memory system 213. The transceiver 214 is to couple with an antenna (not shown) and facilitates transmitting and receiving of RF signals by the communication circuitry 110.

In embodiments, when operating as a receiver, the transceiver 214 filters and mixes received RF signals with a local oscillator signal to down-convert the desired frequency (e.g., or channel) to an intermediate frequency. In an embodiment, the down-conversion process provides the intermediate frequency as complex I and Q signals which are sampled and digitized by an analog to digital converter of the transceiver 214. A phase estimator of the transceiver 214 may perform calculations to estimate the phase of the RF signal for the time it was received at the antenna using the I and Q values, and forward the phase value to a demodulator of the transceiver, which forwards a decoded sequence of 1s and 0s to the signal processor for further processing (e.g., packet processing). When operating as a transmitter, the transceiver 214 generally performs the operations in reverse, receiving a sequence of 1s and 0s from the signal processor, modulating the signal, and outputting an analog signal for transmission by an antenna.

The signal processor 216 provides packet processing in accordance with the communication protocol supported by the communication circuitry 110. For example, the signal processor 216 may execute software and/or algorithms to process various layers of a protocol stack to implement a communication protocol such as Wi-Fi, BT, ZB, or any other communication protocol. The first arbitration logic 218 of the signal processor 216 is to arbitrate media access requests of the communication circuitry 110, 130, and 160. In an embodiment, the first arbitration logic 218 is set to provide arbitration services when certain power domains of the communication circuitry 110 are being powered to support communication circuitry 110 operations (e.g., other than arbitration operations). Example power domains of the communication circuitry 110 are indicated by dashed lines in FIG. 2. For example, the first arbitration logic 218 may provide arbitration if a transceiver power domain of the communication circuitry 110 is being powered to support occurring and/or imminent transmission or receipt. In some embodiments, the first arbitrator logic 218 is implemented by firmware, microcode, or other instructions stored in the memory system 213. Alternatively, the first arbitration logic 218 may be implemented by hardware circuitry or a combination of hardware circuitry and software.

The CPU 232, memory system 233, and transceiver 234 of the communication circuitry 130 and the CPU 262, memory system 263, and transceiver 264 of the communication circuitry 160 may be the same or similar to the CPU 212, the memory system 213, and transceiver 214 of the communication circuitry 110. The signal processor 236 of the communication circuitry 130 is shown to include a second arbitration logic 238. The second arbitration logic 238 of the signal processor 236 is to arbitrate media access requests of the communication circuitry 130 and 160. In an embodiment, the second arbitration logic 238 provides arbitration when it is determined that certain power domains of the communication circuitry 110 are not required to be a powered mode. For example, the second arbitration logic 238 may be set to arbitrate based on the transceiver power domain of the communication circuitry 110 not needing to be powered due to transmit and/or receive inactivity. In some embodiments, the second arbitration logic 238 is implemented by firmware, microcode, or other instructions stored in the memory system 233. Alternatively, the second arbitration logic 238 may be implemented by hardware circuitry or a combination of hardware circuitry and software. Although the signal processor 266 is not shown to include arbitration logic in FIG. 2, other embodiments may include third arbitration logic without departing from the claimed subject matter.

Figure 3:
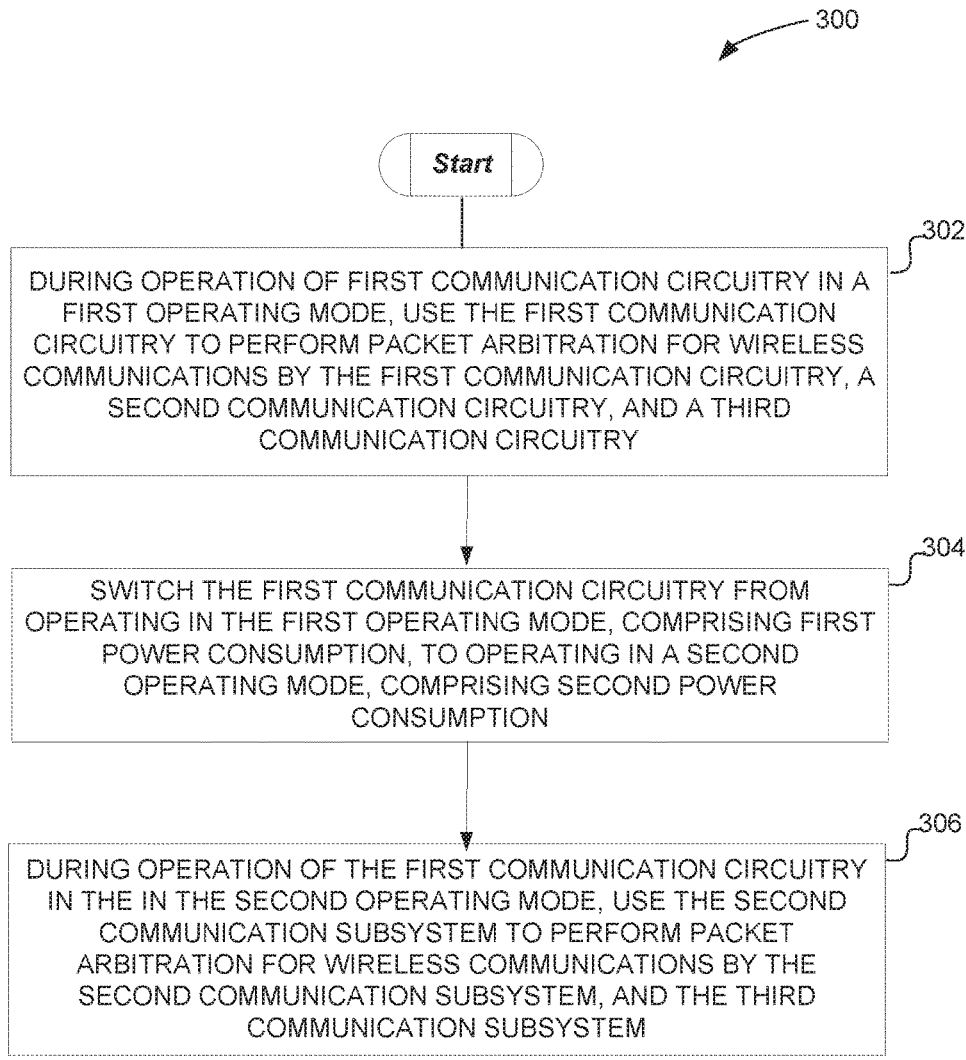
FIG. 3 is flow diagram illustrating a method of providing arbitration, in accordance with embodiments.

FIG. 3 is a flow diagram illustrating a method of providing arbitration, in accordance with embodiments. The method 300 can be performed by processing logic comprising hardware (circuitry, dedicated logic, etc.), software (such as is run on a general-purpose computing system or a dedicated machine), firmware (embedded software), or any combination thereof. In various embodiments, the method 300 may be performed as shown and described with respect to FIG. 2.

For example, at block 302 during operation of the communication circuitry 110 in a first operating mode comprising first power consumption, the method 300 includes using the communication circuitry 110 to perform packet arbitration for wireless communications by the communication circuitry 110, the communication circuitry 130, and the communication circuitry 160.

In an embodiment, the use of the communication circuitry 110 to perform packet arbitration includes receiving by the first arbitration logic 218, a request signal, and a priority signal from one or more of the communication circuitry 130 and the communication circuitry 160, executing an arbitration algorithm, and providing a grant signal or a deny signal to the one or more of the communication circuitry 130 and communication circuitry 160 based on a result of executing the arbitration algorithm. In an embodiment, the arbitration logic 218 is implemented by executing firmware by the CPU 212. The firmware may be stored at least in part by the memory system 213.

At block 304, the method 300 includes switching the communication circuitry 110 from operating in the first operating mode to operating in the second operating mode. In embodiments, power consumption in the first operating mode is greater than power consumption in the second operating mode. In various embodiments, switching to the operation in the second operating mode results in consuming less power than the operation in the first operating mode. In embodiments, operating the communication circuitry 110 in the second operating mode includes operating one or more portions of power domains (e.g., the CPU 212, the memory system 213, the transceiver 214, and/or the signal processor 216) of the communication circuitry 110 in a sleep mode (e.g., a non-powered or a reduced power mode).

Switching to operating in the second operating mode may be responsive to the communication circuitry 110 detecting an inactivity of the communication circuitry 110. For example, detecting the inactivity of the communication circuitry 110 may include detecting that the transceiver 214 is not transmitting or receiving certain traffic or traffic types (e.g., an absence of traffic or absence of desired traffic), RF signals, and/or detecting an inactivity of other blocks within the communication circuitry 110. Responsive to the detection of inactivity, the arbitration logic 218 may provide handover data or a handover signal to switch from performing arbitration by the arbitration logic 218, of the communication circuitry 110, to performing arbitration by the arbitration logic 238, of the communication circuitry 130. Alternatively or additionally, arbitration logic 218 may provide handover data including state information, context information, and/or arbitration rules to the arbitration logic 238 related to performing arbitration.

At block 306, during operation of the communication circuitry 110 in the second operating mode comprising the second power consumption, the method 300 includes using the communication circuitry 130 to perform packet arbitration for wireless communications by the communication circuitry 130 and the communication circuitry 160.

In embodiments, using the communication circuitry 130 for the performing of packet arbitration includes receiving by the arbitration logic 238 a request signal and a priority signal from the communication circuitry 160, executing an arbitration algorithm, and providing a grant signal or a deny signal to the communication circuitry 160 based on a result of executing the arbitration algorithm. In embodiments, arbitration logic 238 is implemented by executing instructions by the CPU 232. At least a portion of the firmware may be stored by the memory system 233. In embodiments, where the communication circuitry 110 is operating in a lower power consumption mode and the communication circuitry 130 uses a lower complexity arbitration algorithm (e.g., to arbitrate among two rather than three), the performing of packet arbitration by the communication circuitry 130 consumes less power than the performing of packet arbitration by the communication circuitry 110. In this way, embodiments conserve power (e.g., battery power) for IoT or other communication devices. In an embodiment, responsive to arbitration logic 218 detecting activity of the communication circuitry 110 (e.g., transceiver 214 transmitting or receiving, a presence of traffic or desired traffic), the first arbitration logic 218 may generate a second handover data or signal (e.g., a takeover signal) to switch from performing arbitration by the communication circuitry 130 to performing arbitration by the communication circuitry 110. At that point arbitration logic 238 may provide handover data including state information, context information, and/or arbitration rules to the arbitration logic 218 related to performing arbitration.

Figure 4:
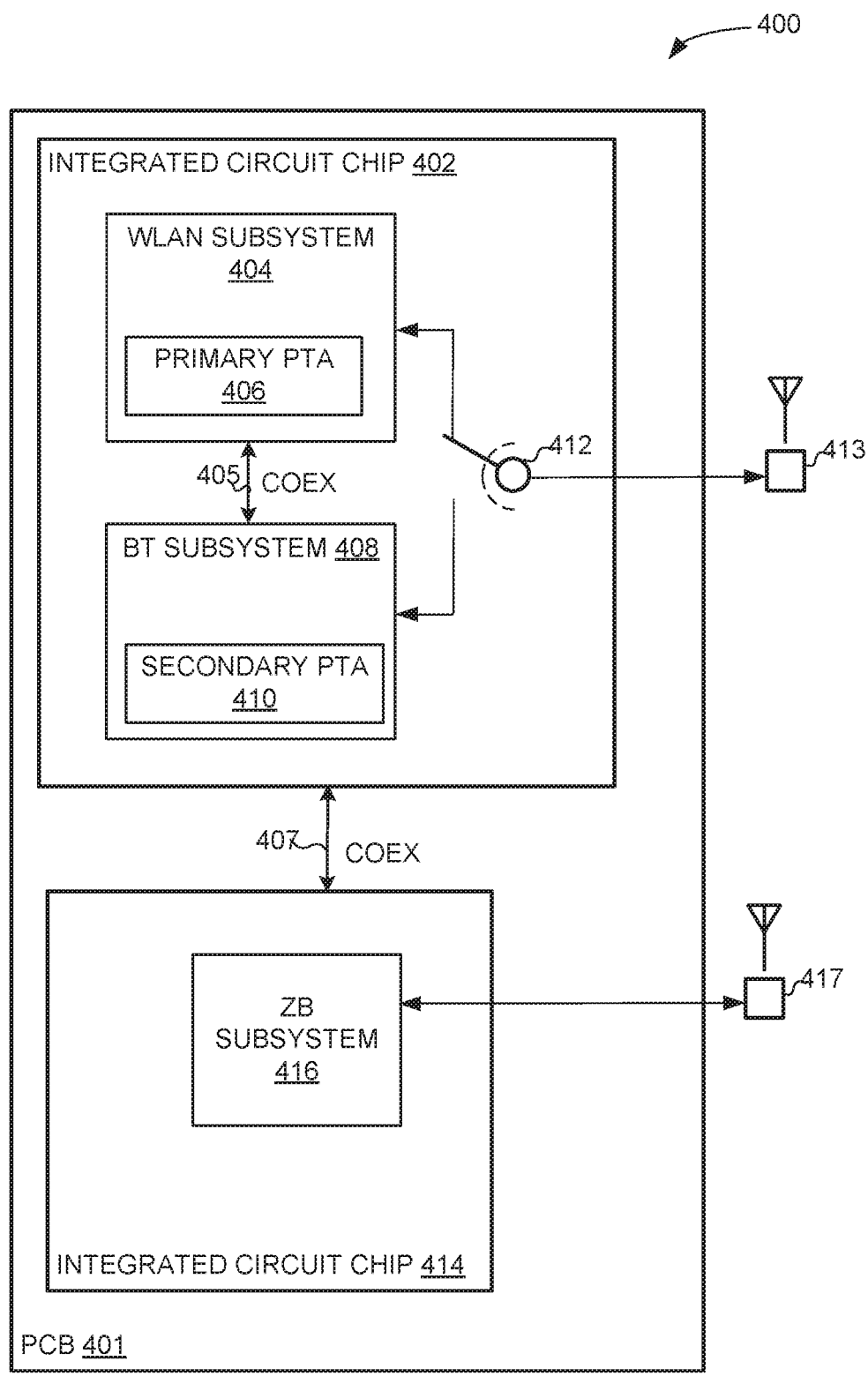
FIG. 4 is a block diagram illustrating a communication system, in accordance with embodiments.

FIG. 4 is a block diagram illustrating a communication system 400, in accordance with embodiments. FIG. 4 is shown to include a printed circuit board 401 including an IC chip 402 coupled to an IC chip 414 via coexistence interface 407. The IC chip 402 is shown to include a WLAN subsystem 404 (e.g., Wi-Fi communication circuitry) that includes a primary PTA 406 coupled via coexistence interface 405 to a BT subsystem 408 (e.g., Bluetooth communication circuitry) that includes a secondary PTA 410. The coexistence interfaces 405 and 407 may be the same or similar to the coexistence interfaces 205, 207, and/or 209 of FIG. 2.

The selector 412 (e.g., a switch function) is to alternately couple shared antenna(s) 413 to the WLAN subsystem 404 and to the BT subsystem 408. In an embodiment, the WLAN subsystem 404 includes circuitry that is the same or similar to the communication circuitry 110 of FIG. 2. The BT subsystem 408 may include circuitry that is the same or similar to the communication circuitry 130 of FIG. 2. The IC chip 414 is shown to be coupled to the IC chip 402 via the coexistence interface 407. The IC chip 414 is shown to include the ZB subsystem 416 (e.g., ZB communication circuitry), which is coupled to one or more antennas 417. In an embodiment, the ZB subsystem 416 may include circuitry that is the same or similar to the communication circuitry 160 of FIG. 2.

In a particular embodiment, an arbiter role can be provided during a first period by the primary PTA 406 and during a second period by the secondary PTA 410. The primary PTA 406 and the secondary PTA are implemented on the same IC chip and the WLAN subsystem 404 and BT subsystem 408 are shown to share one or more antennas 413. In other embodiments, the WLAN subsystem 404, the primary PTA 406, the BT subsystem 408, the secondary PTA 410, and/or the ZB subsystem may be disposed on the same or different PCBs and/or ICs without departing from the claimed subject matter.

In an embodiment, the IC chip 402 includes an integrated single-chip combo solution that implements collaborative coexistence hardware mechanisms and algorithms to enable WLAN, BT, and ZB subsystems to operate concurrently and/or simultaneously. The IC chip 402 arbitrates as described herein for maximization of medium access time, throughput, and audio quality. In an embodiment, collaborative coexistence between WLAN, BT, and ZB subsystems may be implemented by the primary PTA 406 and the secondary PTA 410 in connection with IEEE 802.15.2 PTA and through the coexistence interfaces 405 and 407, respectively. The primary PTA 406 and the secondary PTA 410, using PTA's prioritization approaches between data types and applications and/or other arbitration algorithms, pursue optimum performance for the particular circumstances and design constraints of the communication system. Through embodiments described herein, overall quality for simultaneous voice, video, and data transmission on an embedded system can be achieved while reducing power consumption compared prior PTA implementations.

Figure 5:
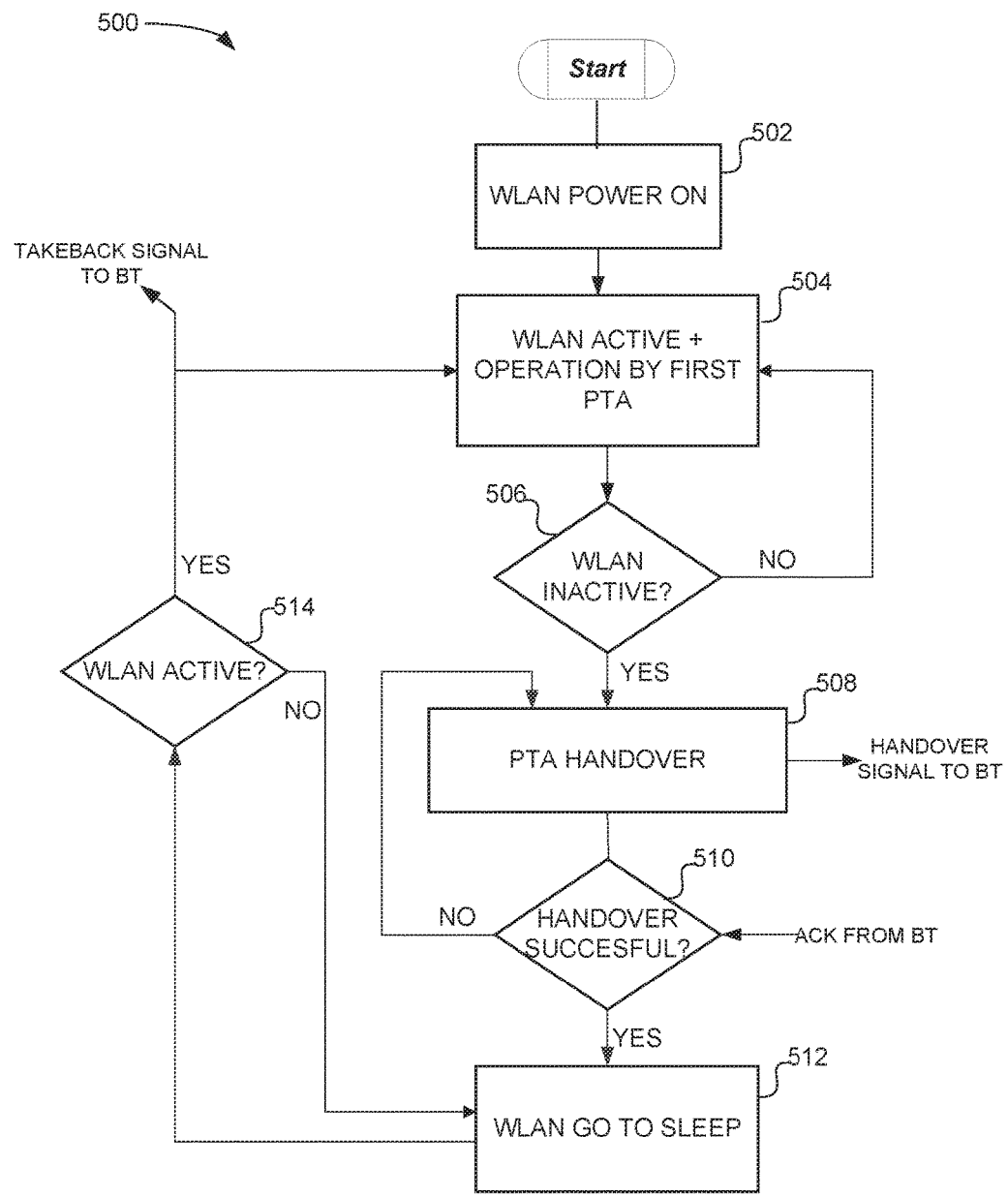
FIG. 5 is a flow diagram illustrating a method of packet transfer arbitration by a WLAN subsystem, in accordance with an embodiment.

FIG. 5 is a flow diagram illustrating a method of packet traffic arbitration by a WLAN subsystem, in accordance with embodiments. The method 500 can be performed by processing logic comprising hardware (circuitry, dedicated logic, etc.), software (such as is run on a general-purpose computing system or a dedicated machine), firmware (embedded software), or any combination thereof. In various embodiments, the method 500 may be performed as shown and described with respect to FIG. 4.

At block 502, the WLAN subsystem 404 including the primary PTA 406 is powered on and begins operation in a first mode. At block 504, the WLAN subsystem 404 is active by default and operates in a first power consumption mode. The primary PTA operates to arbitrate for packet transfer requests by the WLAN subsystem 404, the BT subsystem 408, and the ZB subsystem 416.

At block 506, the primary PTA 406 monitors whether the WLAN subsystem 404 is active or inactive. Responsive to a determination at block 506 that the WLAN subsystem 404 is active, the primary PTA continues to assume the arbiter role. Responsive to a determination at block 506 that the WLAN subsystem 404 is inactive, at block 508, the primary PTA 406 of the WLAN subsystem 404 generates a PTA handover signal and transfers the handover signal to the BT subsystem 408 via the coexistence interface 405. Alternatively or additionally, WLAN subsystem 404 may provide handover data including state information, context information, and/or arbitration rules to the BT subsystem 408 related to performing arbitration.

At block 510, the primary PTA 406 determines whether the handover signal has been received and acknowledged by the BT subsystem 408 to verify that the arbiter role has successfully been accepted or taken over by the BT subsystem 408. If the handover is not successful, the primary PTA 406 may retransmit the handover signal to the BT subsystem 408. In an embodiment, the primary PTA 406 verifies take over by the secondary PTA 410 based on an acknowledgement signal received from the secondary PTA 410 via the coexistence interface 405. At block 512, responsive to a signal (e.g., sleep signal from the primary PTA 406), the WLAN subsystem 404 switches to operating in a second mode (e.g., a sleep mode) that consumes less power than operating in the first mode of block 504.

At block 514, the primary PTA 406 determines whether the WLAN subsystem 404 is active or not. If the primary PTA 406 determines that the WLAN subsystem 404 is not active, the WLAN subsystem 404 remains in the sleep mode indicated in block 512. If the primary PTA 406 determines that the WLAN subsystem 404 is active, responsive to signal (e.g., a wake signal from the primary PTA 406), the method proceeds back to block 504 where the WLAN subsystem 404 operates in the first power consumption mode and the primary PTA 406 re-assumes the arbiter role. In an embodiment, the primary PTA 406 also generates a takeback signal and provides it to the secondary PTA 410 of the BT subsystem 408 to provide notice of the takeback. The BT subsystem 408 may provide handover data including state information, context information, and/or arbitration rules to the WLAN subsystem 404 related to performing arbitration.

Figure 6:
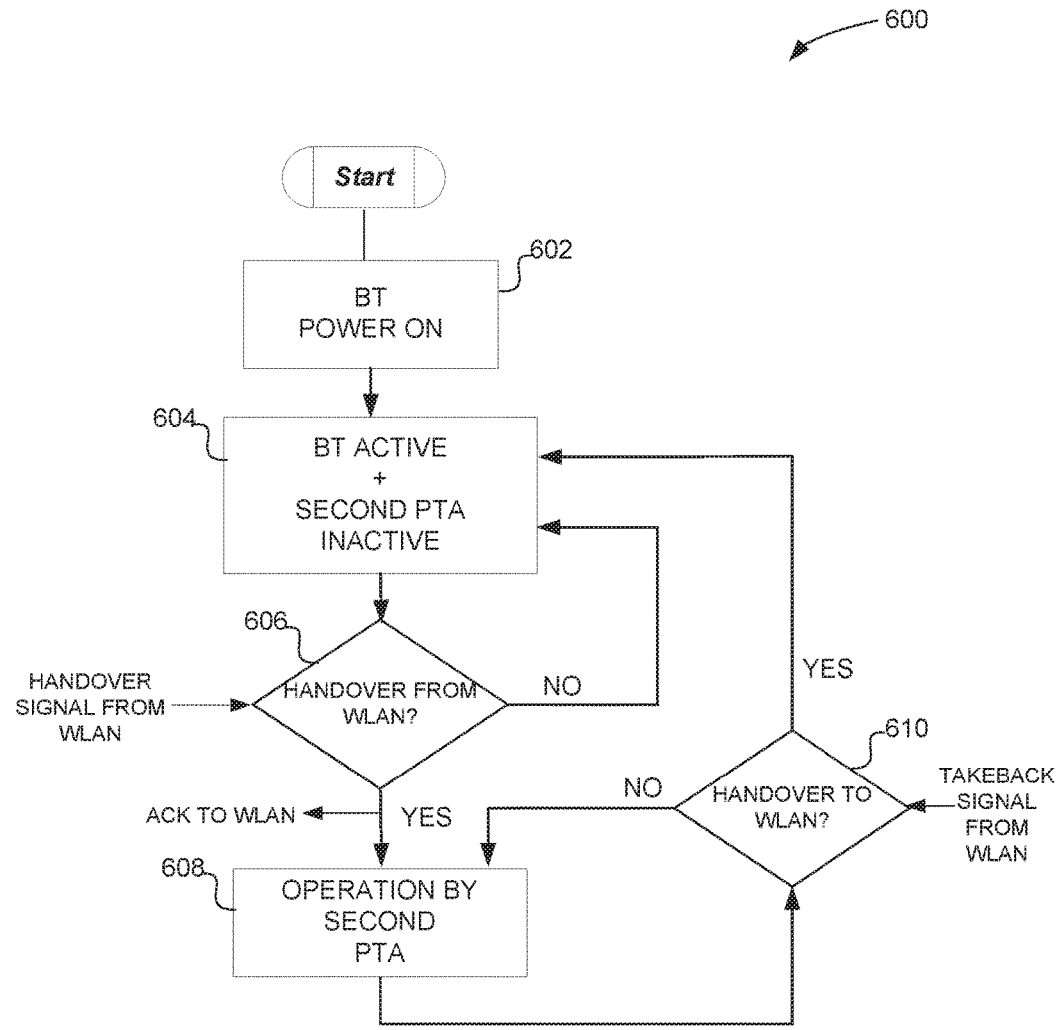
FIG. 6 is a flow diagram illustrating a method of packet transfer arbitration by a BT subsystem, in accordance with embodiments.

FIG. 6 is a flow diagram illustrating a method of packet transfer arbitration by a BT subsystem, in accordance with embodiments. The method 600 can be performed by processing logic comprising hardware (circuitry, dedicated logic, etc.), software (such as is run on a general-purpose computing system or a dedicated machine), firmware (embedded software), or any combination thereof. In various embodiments, the method 600 may be performed as shown and described with respect to FIG. 4.

At block 602, the BT subsystem 408 is powered on. At block 604, the BT subsystem 408 operates in a first mode under which the secondary PTA 410 is inactive with respect to performing arbitration. At block 606, the secondary PTA 410 determines whether the primary PTA 406 of the WLAN subsystem 404 has provided a handover signal. If the secondary PTA 410 does not detect the handover signal, the secondary PTA 410 continues being inactive with respect to arbitration. If the secondary PTA 410 detects the handover signal, the secondary PTA 410 responds to the primary PTA 406 with an acknowledgement signal to verify that the secondary PTA 410 will assume the role of arbitrator (e.g., to allow the WLAN subsystem 404 and primary PTA 406 to consume less power in a sleep mode).

At block 608, the secondary PTA 410 provides arbitration for packet transfers on the medium based on requests by the BT subsystem 408 and the ZB subsystem 416. At block 610, the secondary PTA 410 determines whether the WLAN subsystem 404 has provided a takeback signal. Until the secondary PTA 410 detects the takeback signal, the secondary PTA 410 continues to provide arbitration. Based on detecting the takeback signal, the method returns to block 604 where the BT subsystem 408 is operational for packet transfer but the secondary PTA 410 no does not provide arbitration.

Figure 7:
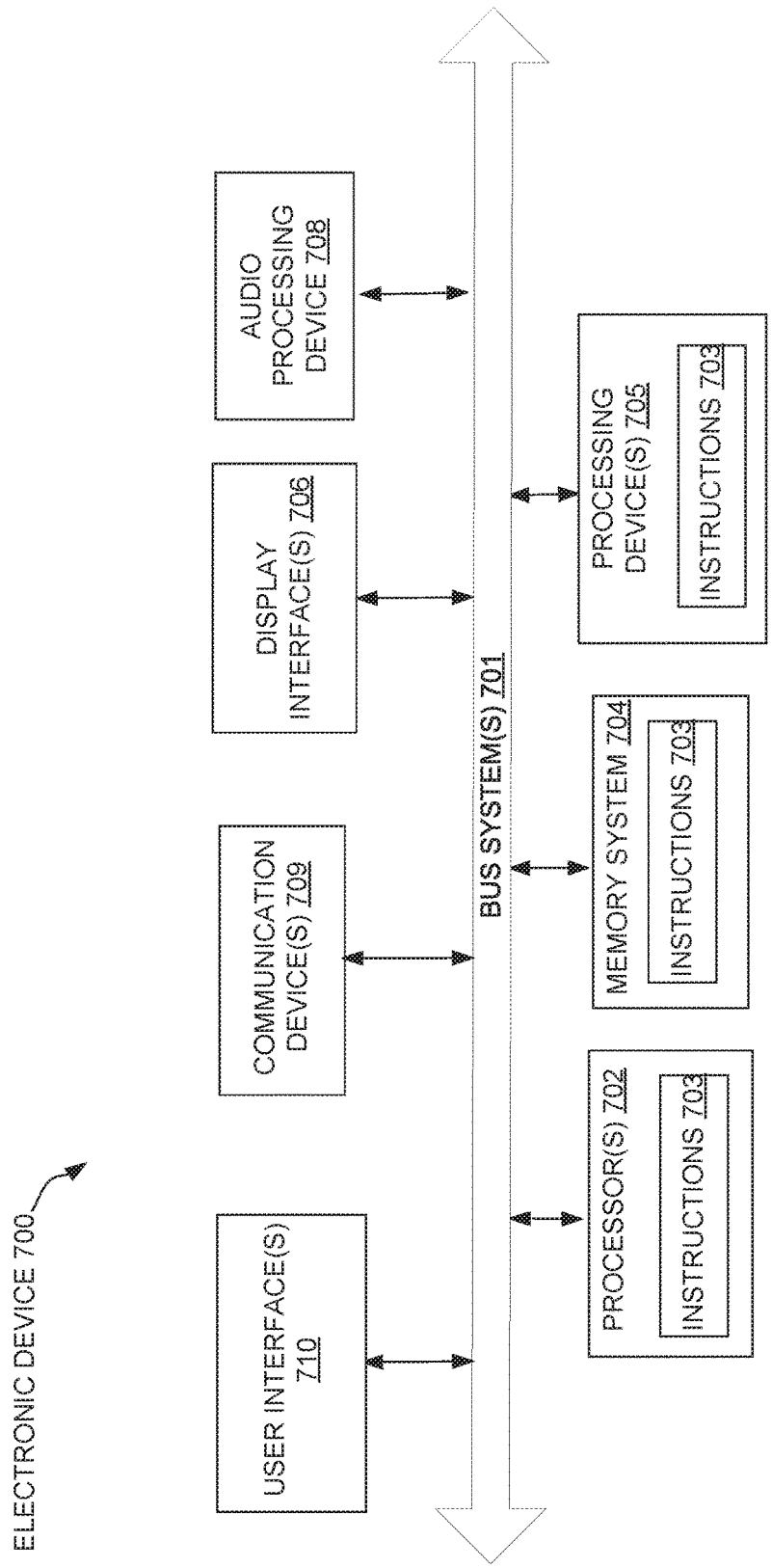
FIG. 7 is a block diagram illustrating an electronic device, in accordance with embodiments.

FIG. 7 is a block diagram illustrating an electronic device 700, in accordance with embodiments. The electronic device 700 may fully or partially include and/or operate the example embodiments of the communication circuitry 110, communication circuitry 130, and/or the communication circuitry 160 of FIG. 2 and/or the PCB or FIG. 4. The electronic device 700 may be in the form of a computer system within which sets of instructions may be executed to cause the electronic device 700 to perform any one or more of the methodologies discussed herein. The electronic device 700 may operate as a standalone device or may be connected (e.g., networked) to other machines. In a networked deployment, the electronic device 700 may operate in the capacity of a server or a client machine in server-client network environment, or as a peer machine in a P2P (or distributed) network environment.

The electronic device 700 may be an Internet of Things (IoT) device, a server computer, a client computer, a personal computer (PC), a tablet, a set-top box (STB), a VCH, a Personal Digital Assistant (PDA), a mobile telephone, a web appliance, a network router, switch or bridge, a television, speakers, a remote control, a monitor, a handheld multi-media device, a handheld video player, a handheld gaming device, or a control panel, or any other machine capable of executing a set of instructions (sequential or otherwise) that specify actions to be taken by that machine. Further, while only a single electronic device 700 is illustrated, the term "device" shall also be taken to include any collection of machines that individually or jointly execute a set (or multiple sets) of instructions to perform any one or more of the methodologies discussed herein.

The electronic device 700 is shown to include processor (s) 702. In embodiments, the electronic device 700 and/or processors(s) 702 may include processing device(s) 705 such as a System on a Chip processing device, developed by Cypress Semiconductor Corporation, San Jose, Calif. Alternatively, the electronic device 700 may include one or more other processing devices known by those of ordinary skill in the art, such as a microprocessor or central processing unit, an application processor, a host controller, a controller, special-purpose processor, DSP, an application specific integrated circuit (ASIC), a field programmable gate array (FPGA), or the like. Bus system 701 may include a communication block (not shown) to communicate with an internal or external component, such as an embedded controller or an application processor, via communication device(s) 709 and/or bus system 701.

Components of the electronic device 700 may reside on a common carrier substrate such as, for example, an IC die substrate, a multi-chip module substrate, or the like. Alternatively, components of the electronic device 700 may be one or more separate ICs and/or discrete components.

The memory system 704 may include volatile memory and/or non-volatile memory which may communicate with one another via the bus system 701. The memory system 704 may include, for example, random access memory (RAM) and program flash. RAM may be static RAM (SRAM), and program flash may be a non-volatile storage, which may be used to store firmware (e.g., control algorithms executable by processor(s) 702 to implement operations described herein). The memory system 704 may include instructions 703 that when executed perform the methods described herein. Portions of the memory system 704 may be dynamically allocated to provide caching, buffering, and/or other memory based functionalities.

The memory system 704 may include a drive unit providing a machine-readable medium on which may be stored one or more sets of instructions 703 (e.g., software) embodying any one or more of the methodologies or functions described herein. The instructions 703 may also reside, completely or at least partially, within the other memory devices of the memory system 704 and/or within the processor(s) 702 during execution thereof by the electronic device 700, which in some embodiments, constitutes machine-readable media. The instructions 703 may further be transmitted or received over a network via the communication device(s) 709.

While a machine-readable medium is in some embodiments a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing or encoding a set of instructions for execution by the machine and that cause the machine to perform any one or more of the example operations described herein. The term "machine-readable medium" shall accordingly be taken to include, but not be limited to, solid-state memories, and optical and magnetic media.

The electronic device 700 is further shown to include display interface(s) 706 (e.g., a liquid crystal display (LCD), touchscreen, a cathode ray tube (CRT), and software and hardware support for display technologies), audio interface(s) 708 (e.g., microphones, speakers and software and hardware support for microphone input/output and speaker input/output). The electronic device 700 is also shown to include user interface(s) 710 (e.g., keyboard, buttons, switches, touchpad, touchscreens, and software and hardware support for user interfaces).

The above description is intended to be illustrative, and not restrictive. For example, the above-described embodiments (or one or more aspects thereof) may be used in combination with each other. Other embodiments will be apparent to those of skill in the art upon reviewing the above description. In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document supersedes the usage in any incorporated references.

Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense. The scope of the claims should be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

What is claimed is:

1. A method comprising:
during operation of first communication circuitry in a first operating mode comprising first power consumption, using the first communication circuitry, performing packet arbitration for wireless communications by the first communication circuitry, second communication circuitry, and third communication circuitry; and
during operation of the first communication circuitry in a second operating mode comprising second power consumption, using the second communication circuitry, performing packet arbitration for wireless communications by the second communication circuitry and the third communication circuitry.

2. The method of claim 1, wherein the first power consumption is greater than the second power consumption.

3. The method of claim 2, wherein the operation of the first communication circuitry in the second operating mode comprising the second power consumption comprises operating one or more power domains of the first communication circuitry in a sleep mode.

4. The method of claim 1, wherein the using of the first communication circuitry includes using Wi-Fi communication circuitry.

5. The method of claim 4, wherein the using of second communication circuitry includes using Bluetooth communication circuitry.

6. The method of claim 1, wherein the third communication circuitry is selected from the group of communication circuitries consisting of Zigbee communication circuitry, Wi-Fi communication circuitry, Bluetooth communication circuitry, global positioning system communication circuitry, and cellular communication circuitry.

7. The method of claim 1, wherein the using of the second communication circuitry for the performing of packet arbitration consumes less power than the using of the first communication circuitry for the performing of packet arbitration.

8. The method of claim 1, further comprising:
detecting an inactivity of the first communication circuitry; and
responsive to detecting the inactivity:
providing first handover data to switch from performing arbitration by the first communication circuitry to performing arbitration by the second communication circuitry, and
switching the first communication circuitry from operating in the first operating mode to operating in the second operating mode.

9. The method of claim 8, wherein detecting the inactivity of the first communication circuitry comprises detecting an absence of traffic associated with the first communication circuitry.

10. The method of claim 9, further comprising, responsive to detecting activity of the first communication circuitry, providing a second handover data to switch from performing arbitration by the second communication circuitry to performing arbitration by the first communication circuitry.

11. The method of claim 1, wherein the using of the first communication circuitry for the performing of packet arbitration comprises receiving by the first communication circuitry a request signal and a priority signal from one or more of the second communication circuitry and the third communication circuitry, executing an arbitration algorithm, and providing a grant signal or a deny signal to the one or more of the second communication circuitry and the third communication circuitry based on a result of executing the arbitration algorithm.

12. The method of claim 1, wherein using the second communication circuitry for the performing of packet arbitration comprises receiving by the second communication circuitry a request signal and a priority signal from the third communication circuitry, executing an arbitration algorithm, and providing a grant signal or a deny signal to the third communication circuitry based on a result of executing the arbitration algorithm.

13. A system comprising:
first communication circuitry comprising first arbitration logic; and
second communication circuitry comprising second arbitration logic, wherein during operation of the first communication circuitry in a first power consumption mode, the first arbitration logic is configured to perform packet traffic arbitration for packet transfers associated with the first communication circuitry, the second communication circuitry, and a third communication circuitry, wherein during operation of the first communication circuitry in a second power consumption mode, the second arbitration logic is configured to perform packet traffic arbitration for packet transfers associated with the second communication circuitry and the third communication circuitry.

14. The system of claim 13, further comprising a coexistence interface coupled to the first communication circuitry and the second communication circuitry, wherein responsive to an inactive status of the first communication circuitry, the first communication circuitry is configured to transmit a handover signal to the second communication circuitry via the coexistence interface and switch from operating in the first power consumption mode to operating in the second power consumption mode, wherein the second arbitration logic is configured to perform the packet traffic arbitration for packet transfers associated with the second communication circuitry and the third communication circuitry, responsive to the handover signal.

15. The system of claim 13 wherein the first communication circuitry is disposed on a first integrated circuit chip and the third communication circuitry is disposed on a second integrated circuit chip, wherein the second integrated circuit chip comprises a coexistence interface configured to couple the third communication circuitry to the first communication circuitry and to the second communication circuitry.

16. Communication circuitry, comprising:
a transceiver configured to transmit and receive radio frequency signals;
a signal processor coupled to the transceiver and configured to process packets; and
arbitration logic coupled to the signal processor, the arbitration logic configured to:

based on transmit or receive activity by the communication circuitry, perform packet traffic arbitration for wireless communication requests by the communication circuitry and a plurality of other communication circuitries, and based on transmit and receive inactivity of the communication circuitry, provide a handover signal to signal another arbitration logic of the plurality of communication circuitries to perform packet traffic arbitration for wireless communication requests by at least two communication circuitries of the plurality of other communication circuitries.

17. The communication circuitry of claim 16, wherein the arbitration logic and the other arbitration logic are disposed on a same integrated circuit chip.

18. The communication circuitry of claim 16, wherein based on transmit and receive inactivity of the communication circuitry, the arbitration logic is further configured to provide a sleep signal to place at least one power domain of the communication circuitry in a sleep mode.

19. The communication circuitry of claim 18, wherein based on transmit or receive activity of the communication circuitry, the arbitration logic is further configured to provide a wake signal to wake up the at least one power domain of the communication circuitry from the sleep mode.

20. The communication circuitry of claim 16, wherein the communication circuitry comprises Wireless Local Area Network circuitry and another communication circuitry, of the plurality of communication circuitries, comprises Bluetooth circuitry.

* * * * *